(12) United States Patent
Bhargava et al.

(10) Patent No.: US 8,971,098 B1
(45) Date of Patent: Mar. 3, 2015

(54) LATCH-BASED ARRAY WITH ENHANCED READ ENABLE FAULT TESTING

(71) Applicant: QUALCOMM Incorporated, San Diego, CA (US)

(72) Inventors: Gaurav Bhargava, San Diego, CA (US); Ramaprasath Vilangudipitchai, San Diego, CA (US); Ohsang Kwon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/023,382

(22) Filed: Sep. 10, 2013

(51) Int. Cl.
G11C 11/00 (2006.01)
G11C 29/00 (2006.01)
G11C 7/00 (2006.01)

(52) U.S. Cl.
CPC . *G11C 29/00* (2013.01); *G11C 7/00* (2013.01)
USPC .......................................... 365/154; 365/201

(58) Field of Classification Search
USPC ................................................. 365/154, 201
See application file for complete search history.

(56) References Cited

U.S. PATENT DOCUMENTS

| | | | |
|---|---|---|---|
| 5,659,690 A | 8/1997 | Stuber et al. | |
| 6,611,932 B2 | 8/2003 | How et al. | |
| 7,046,066 B2 | 5/2006 | Saado et al. | |
| 7,123,542 B2 | 10/2006 | Fekih-Romdhane et al. | |
| 7,134,058 B2 | 11/2006 | Lauga | |
| 7,313,739 B2 | 12/2007 | Menon et al. | |
| 7,487,417 B2 | 2/2009 | Branch et al. | |
| 7,676,709 B2 | 3/2010 | Chan | |
| 7,925,937 B2 | 4/2011 | Irby et al. | |
| 8,848,429 B2 * | 9/2014 | Vilangudipitchai et al. | 365/154 |
| 2005/0055592 A1 | 3/2005 | Velasco et al. | |
| 2007/0115751 A1* | 5/2007 | Kim et al. | 365/233 |
| 2008/0030245 A1 | 2/2008 | Elrod et al. | |
| 2008/0123452 A1 | 5/2008 | Kim | |

OTHER PUBLICATIONS

Intel, "Intel OpenSource HD Graphics Programmer's Reference Manual," Revision 1.0, http://intellinuxgraphics.org/documentation/IVB/IHD_OS_Vol1_Part6.pdf, May 31, 2012, Section 1.5.2, pp. 73.

* cited by examiner

*Primary Examiner* — Hoai V Ho
(74) *Attorney, Agent, or Firm* — Haynes and Boone, LLP

(57) ABSTRACT

A latch-based array includes a plurality of columns and rows. Each column comprises a plurality of slave latches that all latch in parallel a master-latched data output from the column's master latch during normal operation. In a fault-testing mode of operation, one of the slaves in the column latches an inverted version of the master-latched data output while the remaining slave latches in the column latch the master-latched data output. In this fashion, the slave latches are decorrelated in a single write operation.

19 Claims, 3 Drawing Sheets

LATCH-BASED ARRAY WITH ENHANCED READ ENABLE FAULT TESTING

TECHNICAL FIELD

This application relates to latch-based arrays, and more particularly to a latch-based memory array configured for read enable fault testing using a single write operation.

BACKGROUND

To save die space in latch-based arrays, it is known to use a master latch that drives a data output in parallel to a column of slave latches. For example, FIG. 1 illustrates a column 101 for a latch-based array 100. Column 101 includes a single master latch 105 that drives a master-latched data output 102 in parallel to four slave latches 110. For each column 101, slave latches 110 correspond to the various rows, ranging from a slave latch in row 0 to a slave latch in row 1 The master and slave latches are driven by a clock signal 135, which is gated for the rows during a write operation so that it is asserted to only an active row of slaves (the row being written to or read from). Clock signal 135 is thus equivalent to a word line signal for slave latches 110 in that an entire row of slaves is activated at a time by clock signal 135. Clock signal 135 is gated to all the remaining rows during the activation of a particular row.

Master latch 105 is always clocked during a write operation regardless of which row is selected for the write operation. For example, master latch 105 may be an active low latch whereas slave latches 110 may be active high latches. As clock signal 135 goes low, master latch 105 latches an input data signal 103 to form master-latched data output 102. As clock signal 135 goes high for the selected row (the row receiving the non-gated clock signal 135), the corresponding slave latch 110 in the selected row latches master-latched data output 102. In this fashion, when a particular row's clock signal 135 is activated (not gated), master latch 105 and the slave latch 110 for the selected row form a rising-edge-triggered flip-flop combination that latches master-latched data output 102 in a write operation. If master-latched data output 102 wasn't shared by the column's slave latches, there would need to be three more master latches in column 101 such that each row/column intersection would have its own master/slave flip-flop pair. In contrast, the shared master architecture in column 101 needs only a single master latch 105. The data outputs from the slave latches 110 for each row in column 101 range from a data output IW0 for row 0 to a data output IW3 for row 3. A 4:1 output multiplexer 115 selects from these row data outputs IW0 through IW3 to provide a column data output 117 responsive to decoding two address bits A0 and A1.

To save die space, it is conventional to implement output multiplexer 115 with a two-to-four decoder 120 and an associated collection of logic gates. Two-to-four decoder 120 is configured to produce four read enable signals RE0, RE1, RE2, and RE3 responsive to decoding the two address bits A0 and A1. Only one read enable signal is asserted in any given read operation. For example, if RE0 is asserted to a logical one value, the remaining read enable signals RE1, RE2, and RE3 all de-asserted (equaling logical zero values in an active high embodiment).

Each row's data output and read enable signal are processed by a corresponding AND gate. For example, an AND gate 125 processes IW0 and RE0 for row 0, an AND gate 130 processes IW1 and RE1 for row 1, and an AND gate 140 processes IW2 and RE2 for row 2. Finally, an AND gate 145 processes IW3 and RE3 for row 3. An OR gate 150 ORs the outputs from the AND gates to provide column data output 117 responsive to the asserted read enable signal. Based upon the address signals A0 and A1, decoder 120 asserts only one of the read enable signals in any given read operation. Although instantiating 4:1 output multiplexer 115 in this fashion is advantageous with regard to saving die space, the resulting fault testing of the read enable signals such as RE0 through RE3 is problematic as discussed further below.

Read enable fault testing determines whether a read enable signal has a stuck-at-one fault or a stuck-at-zero fault. For example, suppose one wants to test whether a stuck-at-one fault exists for read enable signal RE0. If read enable signal RE0 were stuck at a logical one value, the row 0 data output IW0 will always pass through AND gate 125 regardless of whether another row's read enable signal is being asserted. It is thus important to isolate and identify stuck-at-zero (and stuck-at-one) faults for the read enable signals in a column of slave latches that are all driven in parallel by a master latch. But the isolation of such faults requires complex sequential automated test pattern generation (ATPG) testing to decorrelate a column's slave latches.

Accordingly, there is a need in the art for master/slave latch-based memory arrays having enhanced fault testing for the read enable signals.

SUMMARY

A master/slave latch-based array includes a plurality of slave latches arranged into intersecting columns and rows. A master latch is associated with each column of slave latches. The latch-based array is configured to operate in a normal mode of operation (no fault testing) and in a fault-testing mode of operation. In either mode of operation, the master latch for a column latches a data input to form a master-latched data output responsive to a clock signal. In the normal mode of operation, only an active row of slaves will latch the master-latched data output from their master latches responsive to the clock signal, which is gated off to the remaining rows of slave latches.

In contrast, the clock signal is not gated during a fault-testing mode write operation such that all the slave latches in a column will be clocked by the clock signal. But not all the slave latches will then latch the master-latched data output in a fault-testing mode write operation. Instead, the master-latched data output is inverted for a slave latch in an inverting row such that the inverting row's slave latch latches an inverted version of the master-latched data output during a clock cycle. The remaining slaves in the column are in non-inverting rows and latch the master-latched data output responsive to the same clock cycle. In this fashion, all the slave latches in the column are latched during a single write operation in the fault-testing mode. But the slave latch in the inverting row is decorrelated in this single fault-testing write operation from the remaining slave latches in the column such that a latched data value in the inverting row's slave latch is the complement of a latched data value for the remaining slave latches in the column. The single fault-testing write operation is quite advantageous because the complication of sequential write operation involving ATPG is avoided.

DETAILED DESCRIPTION

Figure 1:
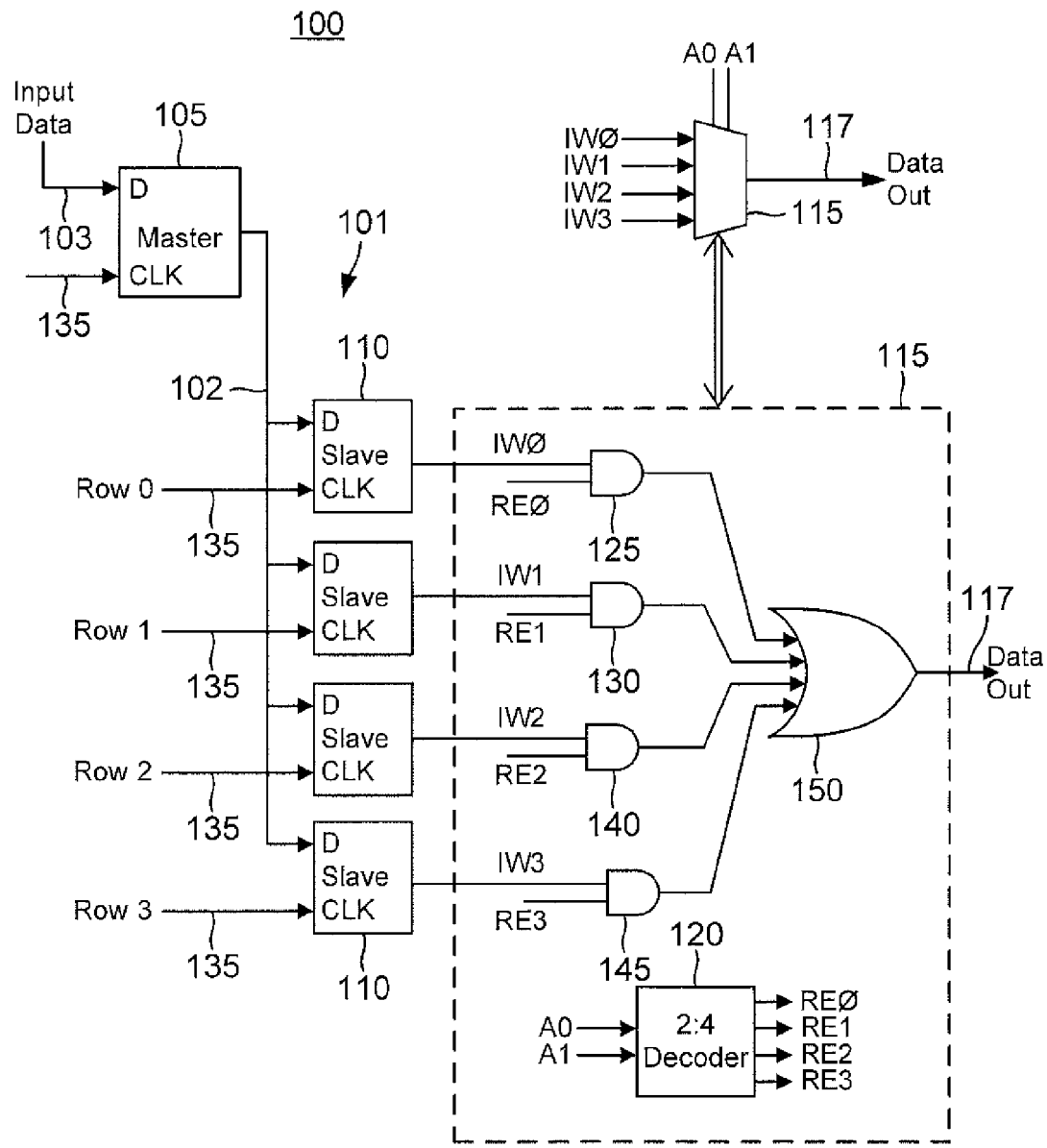
FIG. 1 is a schematic diagram of a column for a conventional master/slave latch-based array.

A master/slave latch-based array is provided that selectively decorrelates a column's slave latch from remaining slave latches in the column in a single write operation. The type of write operation for the slave latches depends upon whether the write operation occurs in a fault-testing mode of operation or in a normal (no fault testing) mode of operation. In particular, the clocking of the slave latches depends upon the mode of operation. During normal operation, only a selected row of slave latches is clocked by a clock signal in a write operation, which is gated off from the remaining rows of slave latches. In response to the clocking, a column's slave latch in the selected row latches a master-latched data output from the column's master latch.

In the fault-testing mode of operation, the clock signal is not gated to the rows such that all the slave latches in a selected column are clocked in a write operation. The slave latches may be characterized as to whether they are located in non-inverting rows or in an inverting row. Each slave latch is located at a row/column intersection such that each row has its own slave latch within a column of slave latches. For each column, there is at least one inverting row configured such that its slave latch latches an inverted version of the master-latched data output responsive to a cycle of the clock signal. The remaining rows in the column are non-inverting rows whose slave latches are configured to latch the master-latched data input responsive to same clock cycle. In this fashion, the slave latch in the inverting row is decorrelated from the remaining slaves in the column such that the slave latch in the inverting row latches a data value that is the complement of a data value latched by the slave latches in the non-inverting rows. For example, if the slave latch in the inverting row latches a binary zero, the remaining slave latches in the non-inverting rows latch a binary one.

Note the advantages of such a decorrelation: in the fault-testing mode, the slave latches in a column are written to in a single write operation such that one of the slave latches is decorrelated from the remaining slave latches. Through this decorrelation, stuck-at-one faults and stuck-at-zero faults for the read enable signals for the master/slave latch-based array are readily determined. As discussed above with regard to conventional array 100, the assertion of a read enable signal for the advantageous master/slave latched-based array disclosed herein is produced by a decoder such that, in the absence of read enable faults, only one row has its read enable signal asserted in any given read operation. Thus, when one row has its read enable signal asserted, the read enable signals for the remaining rows should be de-asserted in the absence of stuck-at-one read enable faults for these remaining rows. Through the decorrelation, a read enable fault may thus be readily determined.

For example, suppose the inverting row's read enable signal has a stuck-at-one fault. The slave latch in the inverting row will thus always drive the column data output for the column regardless of whether other rows are selected for by a corresponding read enable signal. The master latch for a column latches a data input to drive a corresponding master-latched data output to the column's slave latches. The data input to the master latch may then be set to a binary zero value in a fault testing mode to detect a stuck-at-one fault for the inverting row. The master-latched data output latched by the slave latches in the non-inverting rows will thus equal binary zero. But the slave latch in the non-inverting row will latch a binary one. A read enable signal for one of the non-inverting rows may then be asserted. In the absence of read enable faults, the data output for the column should then be a binary zero. But if the read enable signal for the inverting row has a stuck-at-one fault, the column data output will be a binary one. The reading of a binary one in such a case would then identify the stuck-at-one fault for the read enable signal for the inverting row. The detection of stuck-at-one faults for the read enable signals for the non-inverting rows as well as the detection of stuck-at-zero faults for all the read enable signals occurs analogously as discussed further herein.

In contrast to this single write operation decorrelation, a decorrelation for conventional latch-based array 100 would require multiple write operations. For example, suppose one wanted to detect a stuck-at-one fault for row 0 in conventional array 100. A write operation could then be performed to write a binary one into slave latch 110 in row 0. Clock signal 135 for the other rows is gated as discussed above. Another slave latch would then be decorrelated—for example, a write operation may be used to write a binary zero into slave latch 110 in row 1 while all the other rows are gated. If the read enable signal RE1 for row 1 is then asserted and a binary one value obtained for column data output 117, a stuck-at-one fault for RE0 for row 0 is identified. But this conventional read enable fault testing used two separate write cycles to decorrelate the slave latches. These sequential write operations introduce considerable complexity and delay into conventional read enable fault testing. In contrast, the read enable fault testing for the latch-based array disclosed herein is advantageously simple and fast. The innovative features of the disclosed latch-based array may be better appreciated with respect to the following example embodiments.

EXAMPLE EMBODIMENTS

Figure 2:
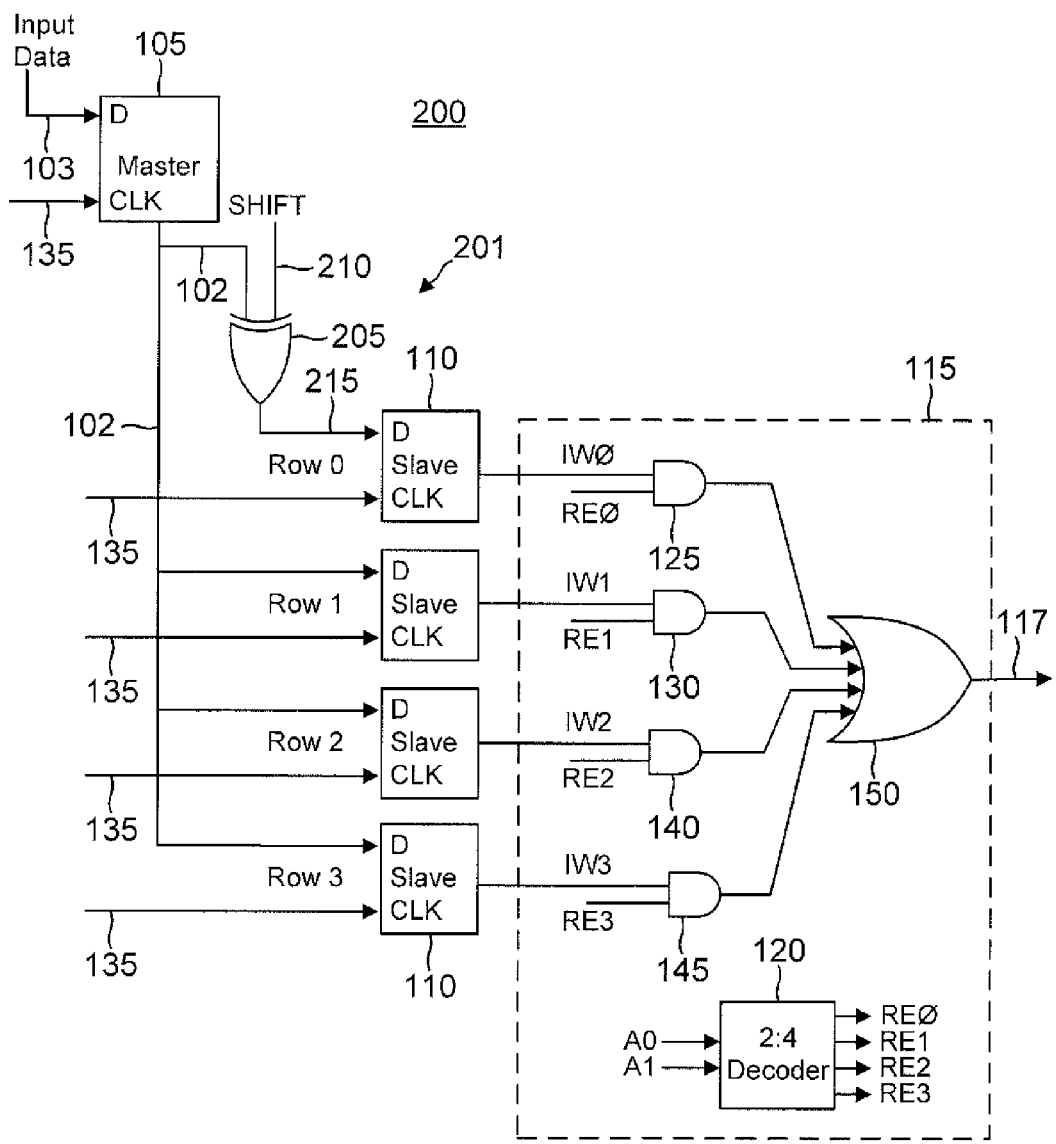
FIG. 2 is a schematic diagram of a column for a master/slave latch-based array configured for enhanced read-enable fault testing.

A column 201 for a latch-based array 200 is shown in FIG. 2. During normal operation, latch-based array 200 functions as discussed with regard to conventional array 100 of FIG. 1. In that regard, column 201 includes single master latch 105 that drives master-latched data output 102 in parallel to four slave latches 110. For each column 201, slave latches 110 correspond to the various rows, ranging from a slave latch 110 in row 0 to a slave latch 110 in row 3. The master and slave latches latch responsive to clock signal 135, which is gated during normal operation so that it is asserted only to an active row of slaves (the row being written to or read from). Clock signal 135 is thus equivalent to a word line signal for slave latches 110 during normal operation in that only a single row of slaves are clocked in any given normal mode write operation. Clock signal 135 would be gated to all the remaining rows during the activation of a particular row.

Analogous to conventional array 100, master latch 105 in array 200 is always clocked during a write operation (regardless of whether array 200 is configured into the normal mode of operation or into the fault-testing mode of operation). For example, master latch 105 may be an active low latch whereas slave latches 110 may be active high latches. When a particular row's clock signal 135 is activated (not gated) for a write operation in the normal mode, master latch 105 and slave latch 110 for the selected row form a rising-edge-triggered flip-flop combination that latches master-latched data output 102 as discussed for conventional array 100. The data outputs from the slave latches for each row in column 201 range from a data output IW0 for row 0 to a data output IW3 for row 3. A 4:1 output multiplexer 115 selects from these row data outputs IW0 through IW3 to provide a column data output 117 responsive to decoding two address bits A0 and A1.

As also discussed for array 100, output multiplexer 115 may be implemented using a two-to-four decoder 120 and an associated collection of logic gates. Two-to-four decoder 120 is configured to produce four read enable signals RE0, RE1, RE2, and RE3 responsive to decoding the two address bits A0 and A1. Only one read enable signal is asserted in any given read operation. For example, if read enable signal RE0 is asserted to a logical one value, the remaining read enable signals RE1, RE2, and RE3 are all de-asserted (equaling logical zero values in an active high embodiment). AND gates 125, 130, 140, and 145 also operate as discussed with regard to array 100.

In contrast to conventional array 100, the rows for array 200 are divided into an inverting row and a remaining set of non-inverting rows. In one embodiment, rows 1, 2, and 3 are non-inverting rows whereas row 0 is an inverting row. During a write operation in the fault-testing mode, the non-inverting rows' slave latches 110 are all clocked by clock signal 135. Similarly, the inverter row's slave latch 110 in column 201 is also clocked by clock signal 135 during a write operation in the fault-testing mode for array 200. All the slave latches 110 will thus latch the signals at their D inputs responsive to clock signal 135 in a single write operation in the fault-testing mode. The slave latches 110 in the non-inverting rows all receive master-latched data output 102 at their data (D) inputs and thus latch master-latched data output 102 responsive to clock signal 135. But slave latch 110 in the inverting row does not receive master-latched data input 102 directly but instead receives a logic gate output 215 from a logic gate 205. Logic gate 205 processes master-latched data output 102 with a shift signal 210 to form logic gate output 215. Logic gate 205 is configured to be selectively inverting or not responsive to shift signal 210. If shift signal 210 is asserted (pulled high in an active high embodiment), logic gate 205 inverts master-latched input signal 102 to form logic gate output 215. But if shift signal 210 is not asserted (pulled low in an active high embodiment), logic gate 210 passes master-latched input signal 102 as logic gate output 215.

In both the normal mode of operation and the fault-testing mode of operation, slave latch 110 in inverting row 0 latches logic gate output 215. In the normal mode of operation, shift signal 210 is not asserted such that logic gate output 215 equals master-latched output signal 102. But in a fault-testing mode of operation, shift signal 210 is asserted such logic gate output 215 equals an inverted version of master-latched output signal 102. Logic gate 205 will pass master-latched data output 102 as logic gate output 215 to the D input of slave latch 110 in the inverting row 0 if shift signal 210 is not asserted (pulled low in an active low embodiment). But if shift signal 210 is asserted, logic gate 210 passes an inverted version of master-latched data output 102 as logic gate output 215 to the D input of slave latch 110 in the inverting row 0.

In one embodiment, logic gate 205 comprises an XOR gate. It will be appreciated, however, that other selectively-inverting logic gates may be used. In general, only one of the slaves in column 201 need be decorrelated in this fashion. Thus, in alternative embodiments, master-latched data output 102 may be decorrelated for a slave latch 110 in one of the rows besides row 0. XOR gate 205 exclusively ORs master-latched data output 102 with shift signal 210 to drive XOR gate output 215 to slave latch 110 in row 0. Shift signal 210 in normal or default operation (no fault testing) is maintained low (corresponding to a logical zero value). Thus, XOR gate 205 has no function during normal operation in that the logical value of an XOR operation of a binary input signal and a logical zero equals the binary input signal. XOR gate 205 thus functions as a means for selectively inverting master-latched data output 102 depending upon the binary state of shift signal 215. Since this means will not invert master-latched data output 102 in the normal mode of operation, slave latch 110 in inverting row 0 will function to latch master-latched data output 102 in normal operation.

During a fault testing mode of operation, shift signal 210 may be asserted high to equal binary one. XOR gate output 215 will thus equal an inverted value of master-latched data output 102. In this fashion, the assertion of shift signal 210 decorrelates XOR gate output 215 from master-latched data output 102 that is written into the remaining slave latches 110 in column 201. This is quite advantageous in that fault testing of the read enable signals requires just a single write operation for a column's slave latches 110. In contrast, read enable signal fault testing for a conventional latch-based array requires at least two sequential write operations as discussed above. This sequential ATPG is complex and error prone. But no such sequential ATPG testing is required to isolate stuck-at-zero or stuck-at-one faults in the read enable signals RE0 through RE3 for latch-based array 200. For example, the following Table 1 illustrates the read enable signal values and corresponding row data outputs for the slave latches to determine a stuck-at-1 fault for the read enable signals:

TABLE 1

| Fault | RE0 | RE1 | RE2 | RE3 | IW0 | IW1 | IW2 | IW3 |
|---|---|---|---|---|---|---|---|---|
| RE0 | 0 | 1 | 0 | 0 | 1 | 0 | 0 | 0 |
| RE1 | 1 | 0 | 0 | 0 | 0 | 1 | 1 | 1 |
| RE2 | 1 | 0 | 0 | 0 | 0 | 1 | 1 | 1 |
| RE3 | 1 | 0 | 0 | 0 | 0 | 1 | 1 | 1 |

To determine a stuck-at-one fault for read enable signal RE0, a zero is latched into master latch 105, which drives master-latched data output 102 accordingly. Due to the inversion in XOR gate 205, XOR gate output 215 to the row 0 slave latch 110 will equal binary one whereas master-latched data output 102 latched in the remaining slave latches for row 1 through row 3 will equal binary zero. Thus, IW0 will equal binary one whereas IW1, IW2, and IW3 will equal binary zero. A read enable signal for one of the non-inverting rows (rows 1 through 3) may then be asserted and column data output 117 obtained. As shown in Table 1, read enable signal RE1 may be asserted although it could equally have been read enable signal RE2 or RE3. Should read enable signal RE0 not have a stuck-at-one fault, column data output 117 will thus equal binary zero. But if read enable signal RE0 is stuck at a binary one value, the binary one value of IW0 will flow through AND gate 125 and through OR gate 150 to raise column data output 117 to binary one. This unexpected binary one value for column data output 117 would thus point to a stuck-at-one fault in read enable signal RE1 using just one write operation for slave latches 110.

The test for the non-inverting rows is the same in that a logical one is loaded into the non-inverting rows' slave latches 110 whereas the row 0 slave latch 110 latches a logical zero because of the inversion in XOR gate 205 responsive to the assertion of shift signal 210. All the read enable signals RE1 through RE3 are kept at zero while read enable signal RE0 is asserted. Since a binary zero is stored in the row 0 slave latch 110 due to the inversion in XOR gate 205 from the assertion of shift signal 210, the reading of IW0 due to the assertion of read enable signal RE0 equal binary zero. But if any of the read enables for the non-inverting rows have a stuck-at-one fault, column data output 117 will be binary one, which identifies the read enable signal stuck-at-one fault.

The detection of stuck-at-zero faults is analogous. For example, the following Table 2 illustrates the read enable signal values and corresponding row data outputs for slave latches 110 to determine a stuck-at-zero fault for the read enable signals:

TABLE 2

| Fault | RE0 | RE1 | RE2 | RE3 | IW0 | IW1 | IW2 | IW3 |
|---|---|---|---|---|---|---|---|---|
| RE0 | 1 | 0 | 0 | 0 | 1 | 0 | 0 | 0 |
| RE1 | 0 | 1 | 0 | 0 | 0 | 1 | 1 | 1 |
| RE2 | 0 | 0 | 1 | 0 | 0 | 1 | 1 | 1 |
| RE3 | 0 | 0 | 0 | 1 | 0 | 1 | 1 | 1 |

To test whether read enable signal RE0 is stuck at zero, the address signals are asserted such that read decoder 120 should drive read enable signal RE0 as a binary one. A zero is written into slave latches 110 except that the slave latch 110 for row 0 is inverted from the assertion of shift signal 210. Row zero output IW0 is thus a binary one whereas IW1, IW2, and IW3 are all binary zeroes. In such a condition, column data output 117 should be a binary one. But if read enable signal RE0 is stuck at zero, then column data output 117 will be a binary zero to indicate this fault. The testing of a stuck-at-zero fault for the remaining read enable signals is analogous except that a binary one is written into the non-inverting rows' slave latches 110 while the row 0 slave latch 110 is inverted so as to latch a binary zero value. For example, to test for a stuck-at-zero fault for read enable signal RE1, read enable signal RE1 is asserted and column data output 117 then obtained. If read enable signal RE1 is without a stuck-at-zero fault, then column data output 117 should equal a binary one. But if column data output 117 equals zero, then a stuck-at-zero fault is indicated for read enable signal RE1. The decorrelation from a logic gate such as XOR gate 205 thus advantageously enables the isolation of stuck-at-zero faults and stuck-at-one faults in a single write operation followed by a read operation. In contrast, prior art techniques required lengthy and complex ATPG testing to isolate such faults. A method of use will now be discussed.

EXAMPLE METHOD OF USE

Figure 3:
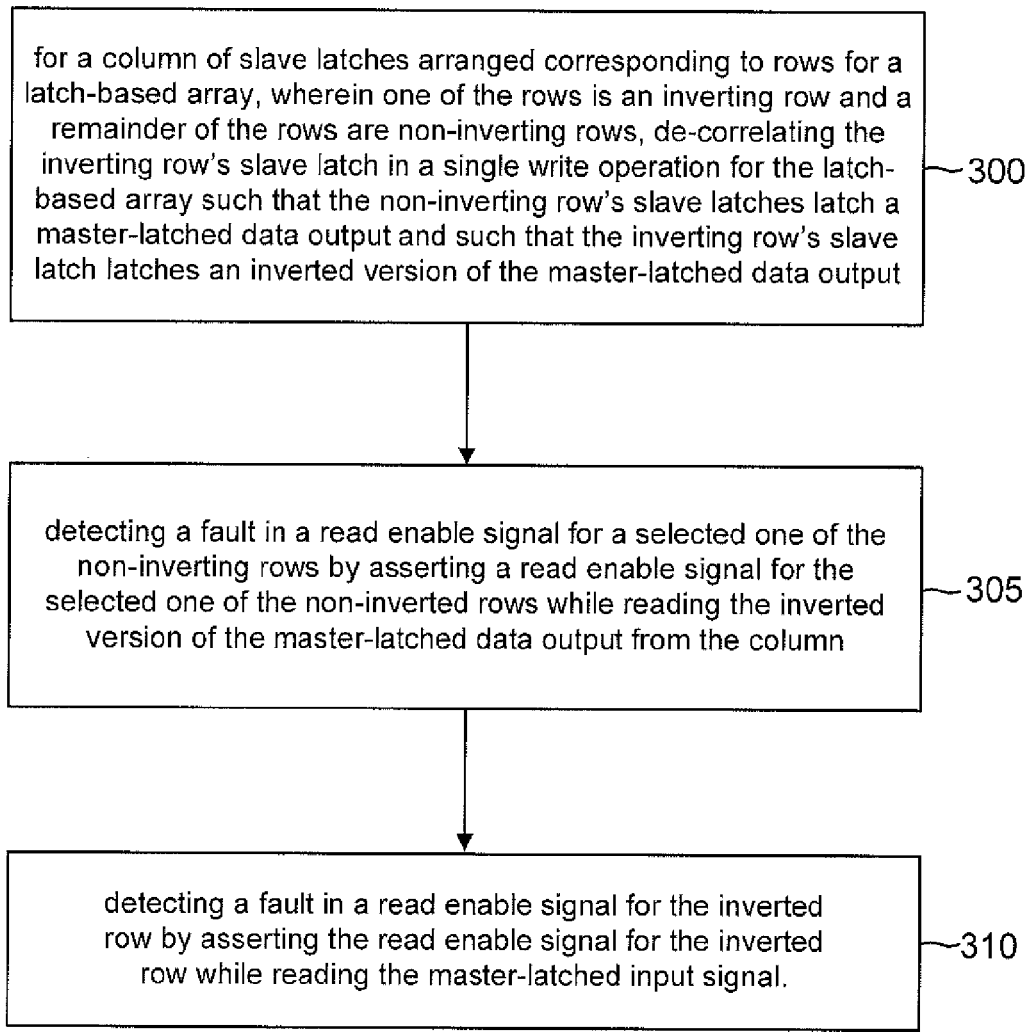
FIG. 3 is a flowchart for a method of operation for the latch-based array of FIG. 2.

A flowchart for an example method of use for the master/slave latch-based array disclosed herein is shown in FIG. 3. This method is defined with regard to a column in the latch-based array of slave latches arranged corresponding to rows for the latch-based array. At least one row is an inverting row whereas the remaining rows are non-inverting rows. In a step 300, the method begins with act of decorrelating the column of slave latches in a single write operation such that the non-inverting rows' slave latches latch a master-latched data output and such that the inverting row's slave latch latches an inverted version of the master-latched data output. Given this decorrelation, fault testing for the read enable signals may proceed as follows. In a step 305, the method continues with the act of detecting a fault in a read enable signal for the inverting row by asserting a read enable signal for one of the non-inverting rows while reading the inverted version of the master-latched data output from the column. A step 310 comprises detecting a fault in a read enable signal for one of the non-inverting rows by asserting the read enable signal for the inverting row while reading the master-latched data output.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A column for a latch-based array, comprising:
a master latch configured to provide a master-latched data output;
a logic gate configured to pass the master-latched data output as a logic gate output responsive to a de-assertion of a shift signal and to pass an inverted version of the master-latched data output as the logic gate output responsive to an assertion of the shift signal;
a plurality of slave latches corresponding to a plurality of rows, wherein one of the rows is an inverting row and a remainder of the rows are non-inverting rows, and wherein the slave latches corresponding to the non-inverting rows are configured in a fault-testing mode to latch the master-latched data output in a single write operation and wherein the slave latch corresponding to the inverting row is configured in the fault-testing mode to latch the logic gate output in the single write operation.

2. The column of claim 1, wherein the logic gate comprises an XOR gate.

3. The column of claim 1, further comprising an output multiplexer configured to generate a plurality of read enable signals corresponding to the plurality of rows to select a row responsive to a decoding of an address for the selected row and to output a latched content of the slave latch corresponding to the selected row.

4. The column of claim 3, wherein the output multiplexer comprises a plurality of AND gates corresponding to the plurality of rows, and wherein for each row, the corresponding AND gate is configured to logically AND the latched content of the slave latch corresponding to the row and the read enable signal corresponding to the row.

5. The column of claim 4, wherein the output multiplexer further comprises an OR gate configured to logically OR an output signal from each of the AND gates to provide a column data output signal.

6. The column of claim 3, wherein the output multiplexer is a 4:1 output multiplexer.

7. The column of claim 1, wherein each slave latch is configured to latch responsive to a clock signal, and wherein the latch-based array is configurable into a normal mode in which the clock signal is gated from all the slave latches except a slave latch for an active one of the rows for a write operation.

8. The column of claim 7, wherein the latch-based array is configured to not gate the clock signal to any of the slave latches in the fault-testing mode.

9. The column of claim 1, wherein the master latch is configured to latch a data input to form the master-latched data output.

10. The column of claim 4, wherein the output multiplexer further comprises a decoder configured to decode the address to form the read enable signals.

11. A method, comprising:
for a column of slave latches corresponding to rows for a latch-based array, wherein one of the rows is an inverting row and a remainder of the rows are non-inverting rows, decorrelating the column of slave latches in a single write operation such that the non-inverting rows' slave latches latch a master-latched data output and such that the inverting row's slave latch latches an inverted version of the master-latched data output;
detecting a fault in a read enable signal for the inverting row by asserting a read enable signal for one of the non-inverting rows while reading the inverted version of the master-latched data output from the column; and
detecting a fault in a read enable signal for one of the non-inverting rows by asserting a read enable signal for the inverting row while reading the master-latched data output from the column.

12. The method of claim 11, further comprising latching a data input into a master latch to form the master-latched data input.

13. The method of claim 11, wherein decorrelating the column of slave latches comprises XOR-ing the master-latched data output with an asserted shift signal to provide the inverted version of the master-latched data output.

14. The method of claim 11, wherein detecting the fault in the read enable signal for one of the non-inverting rows comprises detecting a stuck-at-one fault.

15. The method of claim 11, wherein detecting the fault in the read enable signal for the inverting row comprises detecting a stuck-at-one fault.

16. The method of claim 13, wherein decorrelating the column of slaves occurs in a fault testing mode of operation for the latch-based array, the method further comprising de-asserting the shift signal in a normal mode of operation for the latch-based array.

17. A column for a latch-based array, comprising:
a master latch configured to provide a master-latched data output;
means for selectively inverting the master-latched data output responsive to a shift signal to form a means output, wherein the means is configured to pass the master-latched data output as the means output responsive to a de-assertion of the shift signal and to pass an inverted version of the master-latched data output as the means output responsive to an assertion of the shift signal;
a plurality of slave latches corresponding to a plurality of rows, wherein one of the rows is an inverting row and a remainder of the rows are non-inverting rows, and wherein the slave latches corresponding to the non-inverting rows are configured to latch the master-latched data output in a single write operation and wherein the slave latch corresponding to the inverting row is configured to latch the means output in the single write operation.

18. The column of claim 17, further comprising an output multiplexer configured to generate a plurality of read enable signals corresponding to the plurality of rows to select a row responsive to a decoding of an address for the selected row and to output a latched content of the slave latch corresponding to the selected row.

19. The column of claim 18, wherein the output multiplexer comprises a plurality of AND gates corresponding to the plurality of rows, and wherein for each row, the corresponding AND gate is configured to logically AND the latched content of the slave latch corresponding to the row and the read enable signal corresponding to the row.

* * * * *